United States Patent [19]
Nakata

[11] Patent Number: 5,237,215
[45] Date of Patent: Aug. 17, 1993

[54] ECL MASTER SLICE GATES WITH DIFFERENT POWER LEVELS

[75] Inventor: Tsyuoshi Nakata, Tokyo, Japan

[73] Assignee: NEC Corporation, Japan

[21] Appl. No.: 616,897

[22] Filed: Nov. 21, 1990

[30] Foreign Application Priority Data

Nov. 24, 1989 [JP] Japan ............................ 1-305493

[51] Int. Cl.$^5$ ................ H03K 19/086; H01L 27/118; H01L 27/102
[52] U.S. Cl. ................................... 307/455; 307/467; 257/205; 257/539; 257/563
[58] Field of Search ............... 357/45, 36; 307/467, 307/455; 257/205, 538, 563

[56] References Cited

U.S. PATENT DOCUMENTS

| | | | |
|---|---|---|---|
| 3,558,992 | 1/1971 | Heuner et al. | 357/51 |
| 3,909,636 | 9/1975 | Masaki et al. | 357/40 |
| 4,255,672 | 3/1981 | Ohno et al. | 357/45 |
| 4,388,755 | 6/1983 | Enomoto et al. | 437/51 |
| 4,748,488 | 5/1988 | Suzuki et al. | 307/467 |

*Primary Examiner*—William D. Larkins
*Attorney, Agent, or Firm*—Laff, Whitesel, Conte & Saret

[57] ABSTRACT

A master-slice type semiconductor integrated circuit device of the invention has a master substrate and a plurality of basic cells provided on the master substrate. Each of the basic cells includes a plurality of resistors and a plurality of transistors. A plurality of wirings are provided in the master substrate to form a predetermined logic circuit. The wirings in each of the basic cells are changed such that the current to flow in each transistor may be selected in a number of ways without the logical amplitude being changed in the logical circuit.

3 Claims, 3 Drawing Sheets

ECL MASTER SLICE GATES WITH DIFFERENT POWER LEVELS

BACKGROUND OF THE INVENTION

The present invention relates to a semiconductor integrated circuit device and, more particularly, to a gate array of an ECL (emitter coupled logic) type, which is manufactured in a master-slice method.

Conventionally, an ECL type gate array employs a master substrate in which a number of basic cells each having a plurality of resistors and a plurality of transistors are disposed in a matrix form. In such an ECL type gate array, by means of wiring process, each of the necessary logic blocks is formed with use of one or several basic cells and such logic blocks are interconnected therebetween for achieving the desired functions.

A conventional logic circuit constituted by a basic cell is shown in FIG. 4. In forming the logic circuit in conventional ways, the transistor to be used for a constant current source and the transistors for constituting a differential circuit within the basic cell have been predetermined and also the resistors to be connected to the respective transistors have been predetermined. Therefore, the conventional logic circuit thus formed for a given function can be used only as a circuit performing that particular function. The full description of and problems in such a conventional logic circuit are given later.

SUMMARY OF THE INVENTION

It is, therefore, an object of the present invention to overcome the problems existing in the conventional arrangements and to provide an improved master-slice type semiconductor integrated circuit device.

The present invention provides in one form a master-slice type semiconductor integrated circuit which comprises:

a master substrate;

a plurality of basic cells provided in the master substrate and each including a plurality of resistors and a plurality of transistors; and a plurality of wirings provided for each of the basic cells to form a predetermined logic circuit;

the wirings for each of the basic cells being changed such that the current to flow in each transistor may be selected in a number of ways.

According to the present invention, the wirings are provided to the master substrate which comprises a plurality of basic cells each including a plurality of resistors and a plurality of transistors. By making the necessary changes in the wirings, it is possible to select the current flow in the respective transistors in a number of ways with the logical amplitude of the logic circuit being unchanged. Consequently, it is possible to so arrange that circuit portions which require high speed operation are formed by a basic cell driven by a large current and circuit portions which do not require such high speed operation are formed by a basic cell driven by a small current. This enables saving of the overall power consumption and achieving of the desired high speed performance in the integrated circuit device as a whole.

BRIEF DESCRIPTION OF THE DRAWINGS

The above and other objects, features and advantages of the present invention will be apparent from the following description of preferred embodiments according to the invention explained with reference to the accompanying drawings, in which.

The exemplifications set out herein illustrate the preferred embodiments of the invention and such exemplifications are not to be construed as limiting in any manner.

PREFERRED EMBODIMENTS OF THE INVENTION

Throughout the following explanation, similar reference symbols or numerals refer to the same or similar elements in all the figures of the drawings.

Figure 4:
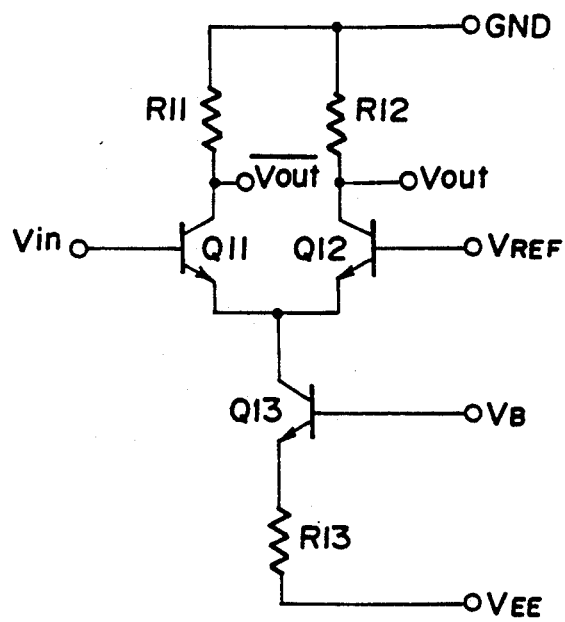
FIG. 4 is a circuit diagram of a prior art circuit.

For the purposes of assisting in the understanding of the present invention, a conventional ECL gate array and the problems existing therein are first described by making reference to FIG. 4 before the present invention is explained.

FIG. 4 shows, in a circuit diagram, a logic circuit of a conventional basic cell for an ECL gate array. As shown therein, there are transistors Q11–Q13 which are NPN bipolar transistors and resistors R11–R13. In the course of wiring process, these elements are connected with one another in the ways as shown in FIG. 4.

The above logic circuit is disposed between a higher potential power supply source GND and a lower potential power supply source $V_{EE}$ and a constant current is supplied thereto by the transistor Q13 having a base connected to a biasing source $V_B$ for the constant current circuit.

An input signal $V_{in}$ is compared with a reference voltage $V_{REF}$ and the resulting signals are outputted from the collector of the transistor Q11 as an inverted output signal $\overline{V_{out}}$ and from the collector of the transistor Q12 as a non-inverted output signal $V_{out}$.

In forming the above logic circuit in conventional ways, the transistor to be used for the constant current source and the transistors for constituting a differential circuit within the basic cell have been allotted in advance and also the resistors to be connected to the respective transistors have been allotted in advance. Therefore, the conventional logic circuit thus formed for a given function can be used only for that particular circuit performing that one function.

In the above described conventional ECL gate array, the circuit employed can be of only one form due to limitations in the area available and the number of elements accommodated and this has caused difficulties in achieving a circuit which is satisfactory from both the aspects of operation speeds and power consumption.

A semiconductor circuit device of the kind in which the present invention is embodied includes a number of logic circuits which function in the same way. Even where the given logic circuits do function the same, the operation speeds required are different depending on the locations of the circuits concerned. Since the conventional arrangement realizes the same logic function in the same circuit configuration, the problems faced are that the operation speeds are too low or slow in some circuits and that unnecessarily large power is consumed in some other circuits.

Thus, one of the objects of the present invention is to provide an ECL type semiconductor circuit in which the overall power consumption is saved and yet the operation speeds are increased and this is achieved by increasing the operation speeds of only the necessary logic circuits while the power consumption is limited where possible.

According to the present invention, a master-slice type semiconductor integrated circuit device comprises a master chip, a plurality of basic cells provided in the master chip and each including a plurality of resistors and a plurality of transistors, and a plurality of wirings provided in the master chip thereby forming a predetermined logic circuit. The necessary changes are made in the wirings such that the current flow in the respective transistors may be selected in a number of ways without the logical amplitude of the logic circuit being changed.

Now, some preferred embodiments of the present invention will be explained hereunder with reference to the drawings.

Figure 1:
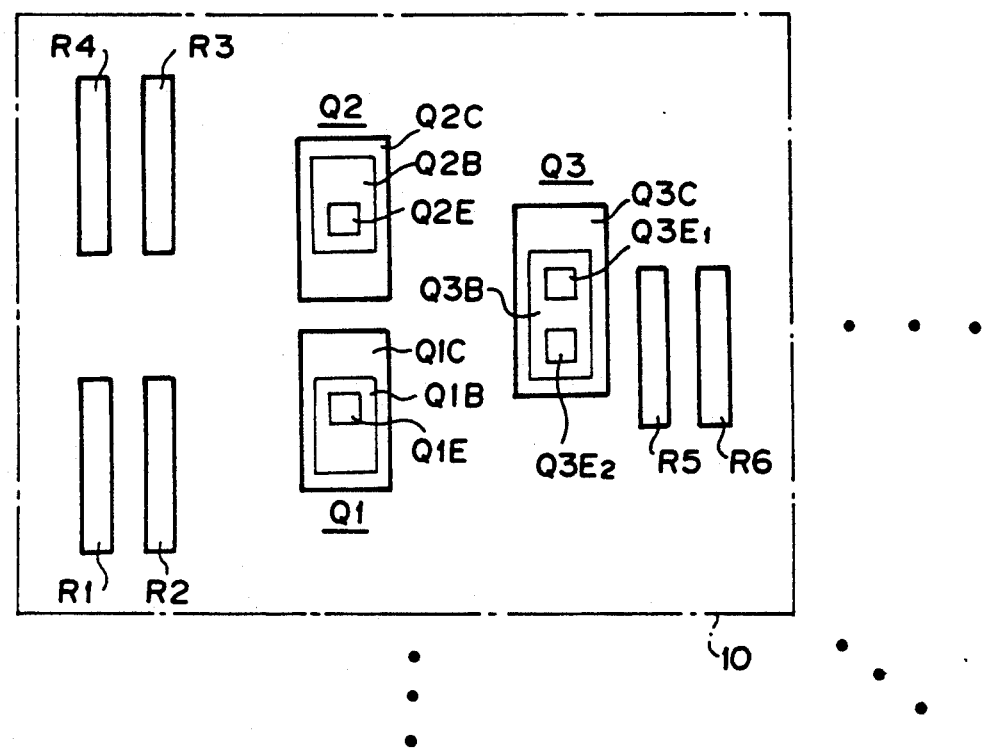
FIG. 1 is a plan view of a part of a master substrate of an ECL gate array as a first embodiment according to the present invention.

FIG. 1 is a plan view of a part of a master substrate of an ECL gate array as a first embodiment according to the present invention. The master substrate 100 includes a number of basic cells which are arranged in a plurality of rows and columns, that is, in a matrix form. Each of the basic cells is fundamentally of the same constitution and FIG. 1 shows only a single cell 10.

The basic cell 10 comprises three NPN transistors Q1, Q2, Q3, two resistors R1, R2 serving as load resistors of the collector of the transistor Q1, two resistors R3, R4 serving as load resistors of the collector of the transistor Q2, and two resistors R5, R6 serving as emitter resistors of the double-emitter type transistor Q3. In the present example, the resistors R1 through R6 are resistors of polycrystal silicon layers (the so-called polysilicon resistors) formed on insulation layers (not shown in the drawings) coated on the semiconductor substrate (not shown either). The resistors R1 through R4 have respectively the same resistance value and the resistors R5, R6 have respectively the same resistance value. The transistors Q1, Q2 have N-type collector regions Q1C, Q2C, P-type base regions Q1B, Q2B and N-type emitter regions Q1E, Q2E, respectively. The transistor Q3 also has an N-type collector region Q3C and a P-type base region Q3B. On the base region Q3B, two N-type emitter regions Q3E$_1$, Q3E$_2$ are formed with the areas being the same. The master substrate 10 has other peripheral circuit portions such as an input and an output buffer circuit but, since they are not directly relevant to the invention, their explanations or illustrations are omitted herein.

The basic cell 10 in the present example is characterized in that the two resistors are allotted to each of the transistors Q1, Q2 and Q3 and that the transistor Q3 as the current source transistor of the ECL circuit has two emitter regions. Therefore, only by making the necessary changes in the wirings in the process to follow, is it possible to arrange that the logical circuit which carries out the same logic function and outputs the resulting signal in the same logical amplitude is rendered to function in two different ways, one as a high speed operation type circuit and the other as a low power consumption type circuit.

Figure 2A:
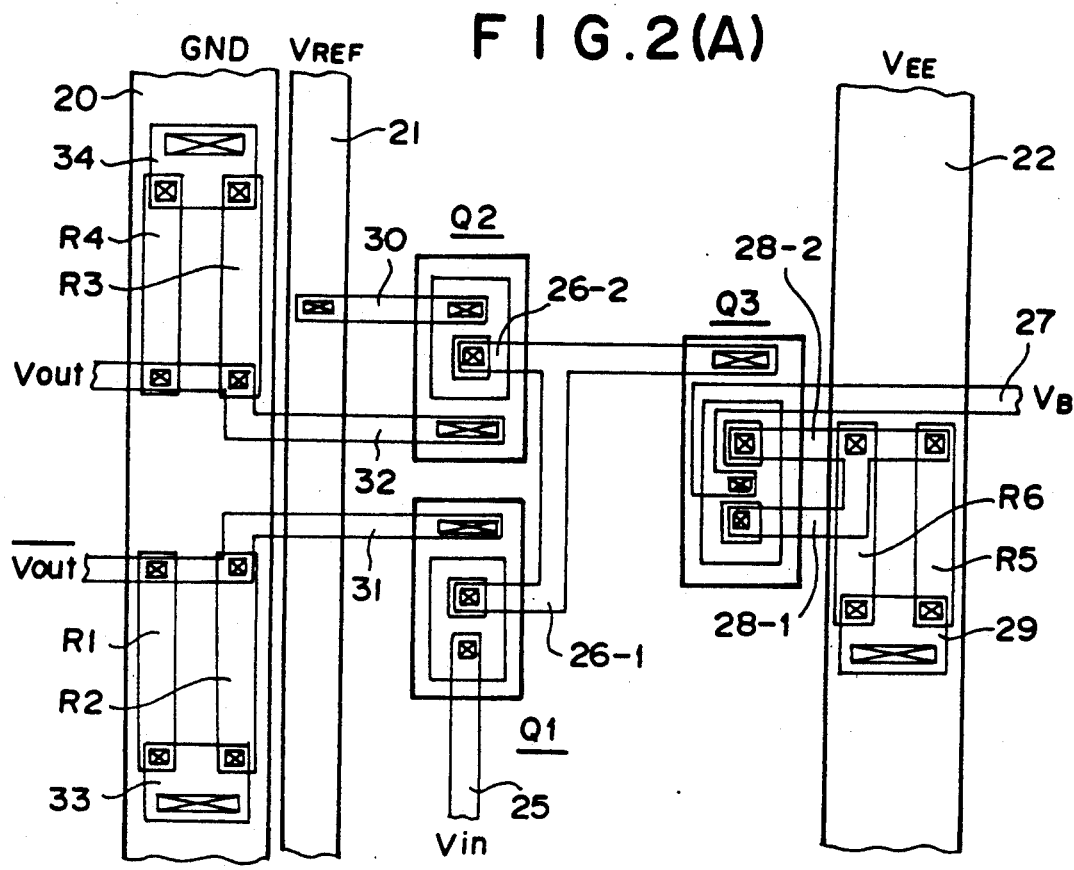
FIG. 2(A) is a diagrammatic plan view illustrating an example of pattern layouts of wirings according to the present invention.
Figure 2B:
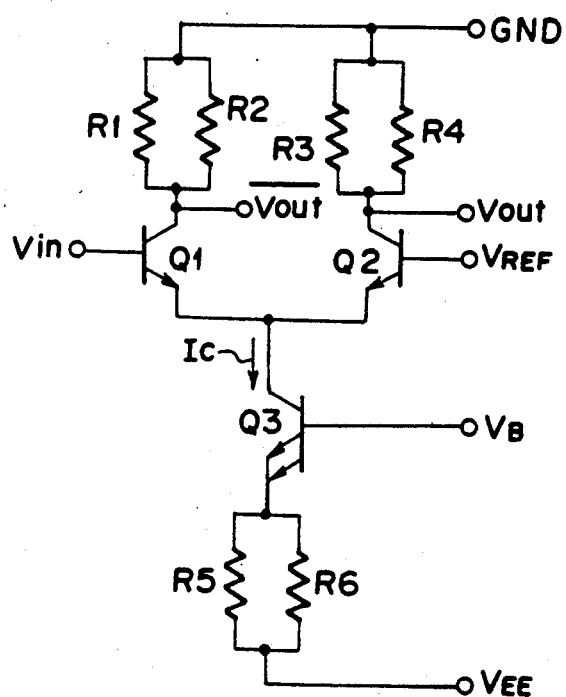
FIG. 2(B) is an equivalent circuit diagram of the layouts shown in FIG. 2(A)

The circuit covered by FIGS. 2(A) and 2(B) is a circuit which effects the same logical functions as does the prior art circuit of FIG. 4 but which is a high speed operation type circuit. FIG. 2(A) shows a pattern layout of the wirings of such circuit and FIG. 2(B) is its equivalent circuit diagram. In this example, the wirings among or between the respective elements are realized by double layered aluminum wirings. Each of the wirings 20, 22 and 21 which respectively transmit the higher potential power source voltage GND, the lower potential power source voltage $V_{EE}$ and the reference voltage $V_{REF}$ is formed by the second of the double layered aluminum wirings and the remaining wirings are formed by the first of the double layered aluminum wirings.

A wiring 25 which transmits the input signal $V_{in}$ is connected to the base Q1B of the transistor Q1. Wirings 26-1, 26-2 led out from the emitters Q1E, Q2E of the respective transistors Q1, Q2 are joined together and connected to the collector Q3C of the transistor Q3. To the base Q3B of the transistor Q3 is connected a wiring 27 which transmits a biasing voltage $V_B$. Wirings 28-1, 28-2 led out respectively from the emitters Q3E$_1$, Q3E$_2$ of the transistor Q3 are joined together in this case and connected to respective one ends of the resistors R5, R6. The other ends of the resistors R5, R6 are connected to a wiring 29 which is connected to a wiring 22 for the lower potential power source voltage $V_{EE}$. The base Q2B of the transistor Q2 is connected to a $V_{REF}$ wiring 21 through a wiring 30. A wiring 31 connected to the collector Q1C of the transistor Q1 is drawn out as the inverted output $\overline{V_{out}}$ and is connected to each of the one ends of the resistors R1, R2. Each of the other ends of the resistors R1, R2 is connected to the GND wiring 20 through a wiring 33. The collector Q2C of the transistor Q2 is connected to each of the one ends of the resistors R3, R4 through a wiring 32 and is drawn out as the non-inverted output $V_{out}$. Each of the other ends of the resistors R3, R4 is connected to the GND wiring 20 through a wiring 34.

The wirings thus formed as explained above are shown in FIG. 2(B) in the from of an equivalent circuit diagram.

Now, assuming that the resistance value of each of the resistors R1-R4 is 3 KΩ, the load resistance for each of the transistors Q1, Q2 will be 1.5 KΩ. Consequently, when a current is taken out at an output, the driving impedance is decreased and becomes smaller than that when one each of the resistance elements is used and the load resistance is made 3 KΩ and this enables achieving the desired high speed operation. In the ECL circuits, usually or frequently, the internal logical amplitude is set in the order of 400–800 mV. However, here, it is assumed that this logical amplitude is set for 600 mV. Then, the collector current [$I_c$ in FIG. 2(B)] of the transistor Q3 is required to be approximately 0.4 mA. If the resistance value of the resistors R5, R6 connected in parallel is assumed to be approximately 1 KΩ (approximately 2 KΩ per resistor) with the forward operating voltage $V_{BE}$ of the transistor Q3 being 0.8 V and the voltage of the biasing source $V_B$ of the constant current circuit with respect tot he power supply source being 1.2 V, the collector current is set to be a constant current of 0.4 mA.

Figure 3A:
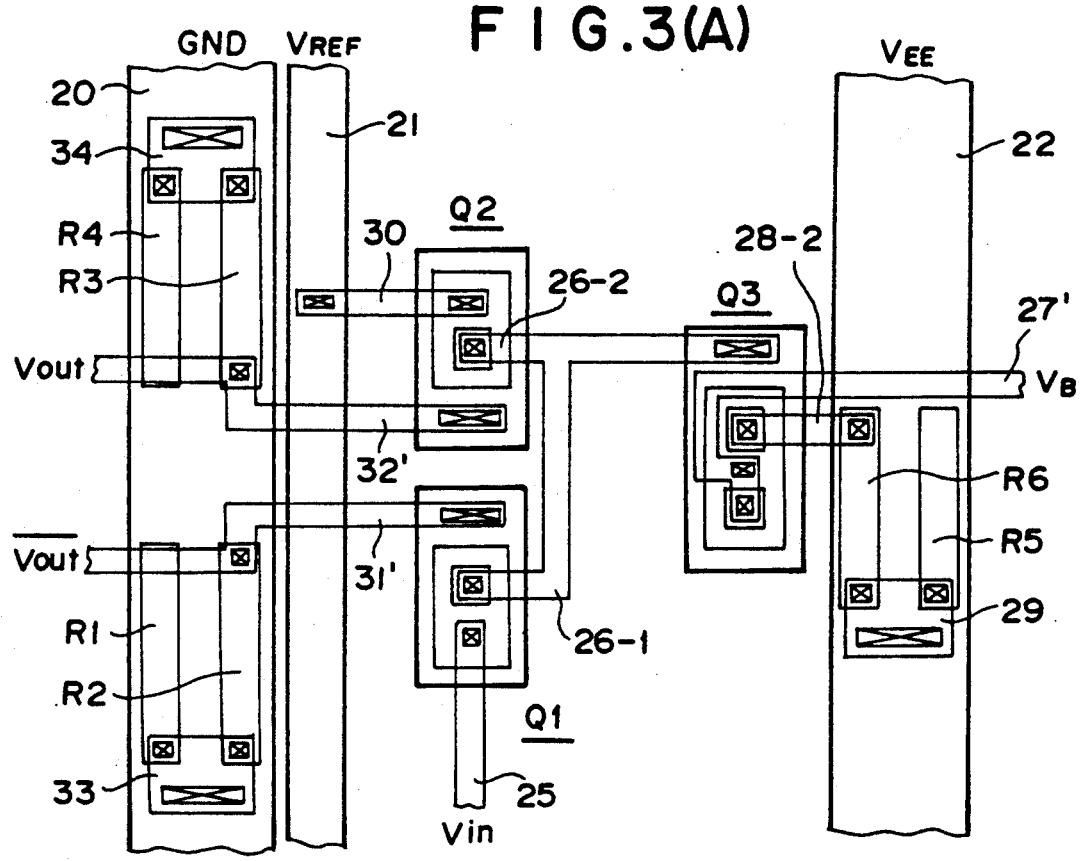
FIG. 3(A) is a diagrammatic plan view illustrating another example of pattern layouts of wirings according to the present invention.

On the other hand, for the constitution of a low power consumption type circuit, the wirings to be provided in the course of their wiring process are as shown in FIG. 3(A). The elements as appearing in FIGS. 2(A) and 2(B) are shown with the same numerals and their explanations are omitted here. A difference herein from a corresponding portion in FIGS. 2(A) and 2(B) is that a wiring 27' for supplying the biasing voltage $V_B$ is connected not only to the base Q3B but also to one emitter $Q3E_2$ of the transistor Q3. The wiring 28-2 which is led out from the other emitter $Q3E_1$ is connected only to one end of the resistor R6. Further, the wirings 31', 32' led out from the respective collectors Q1C, Q2C of the transistors Q1, Q2 are connected only to the respective ones ends of the resistors R2, R3.

Figure 3B:
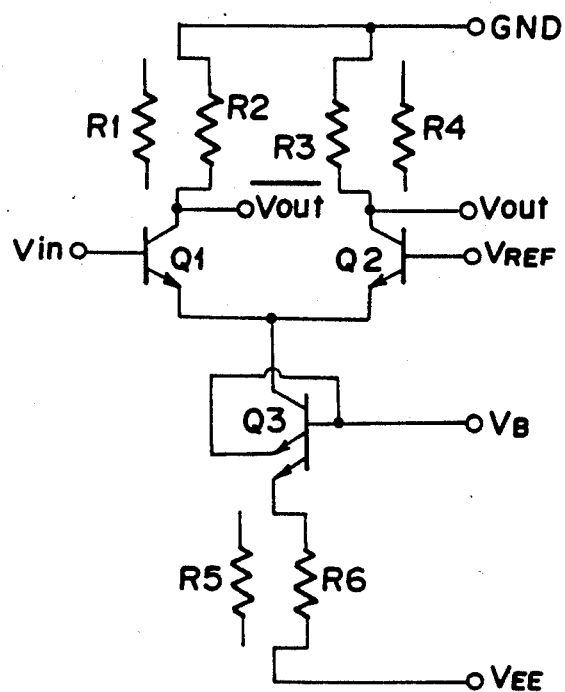
FIG. 3(B) is an equivalent circuit diagram of the layouts shown in FIG. 3(A)

The above circuit in an equivalent circuit is shown in FIG. 3(B). Here, it is assumed that each of the power supply source voltages (GND, $V_{EE}$) is the same as that in FIGS. 2(A) and 2(B). Since the resistance value of the resistor R6 is 2 KΩ and the voltage between $V_B$ and $V_{EE}$ is 1.2 V, the transistor Q3 can supply a constant current of 0.2 mA. The emitter area of the transistor Q3 is made smaller with the decrease in the current to flow therein. Consequently, it si possible to have the power consumption decreased to approximately a half of that in the circuit shown in FIGS. 2(A) and 2(B). However, since the load resistance of the transistors Q1, Q2 is 3 KΩ, the logical amplitude thereof will be 600 mV which is not different from that in the circuit of FIGS. 2(A) and 2(B).

It is to be noted that the present invention is not limited to the embodiments described above. For example, if there is an increase of one resistor for each transistor, the current to flow in each transistor can be selected or set in three different ways. It is also possible for the basic cell 10 to include at least one transistor whose collector and emitter are connected to the collector and the emitter of the transistor Q1. In this case, it is possible to carry out the logic operation for more than two inputs. When either of the inverted output $\overline{V_{out}}$ and the non-inverted $V_{out}$ is unnecessary, the corresponding resistor is not required and can be eliminated, in which case the related collector is connected to the GND wiring directly. Further, it is possible for the basic cell 10 to include as an element therein at lease one emitter-follower transistor which receives the output $V_{out}$ and-/or $\overline{V_{out}}$.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A master-slice type semiconductor integrated circuit device comprising:
    master substrate;
    a plurality of basic cells which are formed in said substrate and each of which includes a first transistor, a second transistor and a third transistor having a base and a first and a second emitter and also includes a first, a second, a third, a fourth, a fifth, and sixth resistor, said first, second, third and fourth resistors having respectively the same resistance value and said fifth and sixth resistors having respectively the same resistance value;
    a plurality of first wirings provided in at least one of said plurality of basic cells, said first wirings having said first resistor connected to a collector of said first transistor, said third resistor connected to a collector of said second transistor, emitters of said first and second transistors commonly connected to a collector of said third transistor, said plurality of first wirings include a wiring for connecting said second emitter of said third transistor to the base thereof, and said fifth transistor connected to said first emitter of said third transistor; and
    plurality of second wirings provided in at least another of said plurality of basic cells, said second wirings having said first and second resistors connected in parallel and connected to the collector of said first transistor, said third and fourth resistors connected in parallel and connected to the collector of said second transistor, the emitters of said first and second transistors are commonly connected to the collector of said third transistor, and said fifth and sixth resistors connected in parallel and connected to both the first and second emitters of said third transistor.

2. A master-slice type semiconductor integrated circuit device comprising:
    a master substrate;
    a plurality of basic cells which are formed in said substrate and each of which includes a first transistor, a second transistor and a third transistor having a first and a second emitter and also includes a first, a second, a third, and a fourth resistor; said first and second resistors having respectively the same resistance value and said third and fourth resistors having respectively the same resistance value;
    a plurality of first wirings provided in at least one of said plurality of basic cells, said first wirings having said first and second resistors connected in parallel and connected to a collector of said first transistor, emitters of said first and second transistors being commonly connected to a collector of said third transistor, said third and fourth resistors being connected in parallel and connected to both the first and second emitters of said third transistor; and
    a plurality of second wirings provided in at least another of said plurality of basic cells, said second wirings having said first resistor connected to the collector of said first transistor, the emitters of said first and second transistors being commonly connected to the collector of said third transistor, and said third resistor being connected to the first emitter of said third transistor, and the second emitter of said third transistor connected to the base thereof.

3. A master-slice type semiconductor integrated circuit comprising:
    a master substrate;
    a plurality of basic cells which are formed in said substrate and each of which includes a first transistor, a second transistor and a third transistor having a first and a second emitter and also includes a first, a second, a third, and a fourth resistor, said first and second resistors having respectively the same resistance value and said third and fourth resistors having respectively the same resistance value;
    a plurality of first wirings provided in at least one of said plurality of basic cells, said first wirings having said first and second resistors connected in parallel and connected to a collector of said first transistor, emitters of said first and second transistors commonly connected to a collector of said third transistor, said third and fourth resistors connected in parallel and connected to both the first and second emitters of said third transistor; and a plurality of second wirings provided in at least another of said plurality of basic cells, said second wirings having said first resistor connected to the collector of said first transistor, the emitters of said first and second transistors commonly connected to the collector of said third transistor, and said third resistor connected to the first emitter of said third transistor and said plurality of second wirings include a wiring for connecting said second emitter of said third transistor to be base thereof.

* * * * *